(12) United States Patent
Kuriyama

(10) Patent No.: US 6,373,325 B1
(45) Date of Patent: Apr. 16, 2002

(54) SEMICONDUCTOR DEVICE WITH A CHARGE PUMPING CIRCUIT

(75) Inventor: Masao Kuriyama, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/523,729

(22) Filed: Mar. 13, 2000

(30) Foreign Application Priority Data

Mar. 18, 1999 (JP) ............................................ 11-073491

(51) Int. Cl.[7] .............................. B05F 3/16; G11C 7/00
(52) U.S. Cl. .................. 327/536; 327/537; 365/189.09; 363/60
(58) Field of Search ................................ 327/536, 537; 307/110; 363/59, 60; 365/189.09, 226

(56) References Cited

U.S. PATENT DOCUMENTS

| | | | | |
|---|---|---|---|---|
| 5,168,174 A | * | 12/1992 | Naso et al. | 327/536 |
| 5,291,446 A | * | 3/1994 | Van Buskirk et al. | 327/540 |
| 5,594,692 A | * | 1/1997 | Yamaguchi | 365/189.09 |
| 6,002,630 A | * | 12/1999 | Chuang et al. | 365/226 |
| 6,008,690 A | * | 12/1999 | Takeshima et al. | 327/536 |
| 6,195,307 B1 | * | 2/2001 | Umezawa et al. | 327/536 |

FOREIGN PATENT DOCUMENTS

| | | | |
|---|---|---|---|
| JP | 4-53260 | 2/1992 | H01L/27/04 |
| JP | 11-46138 | 2/1999 | H03L/7/093 |

* cited by examiner

Primary Examiner—Kenneth B. Wells
Assistant Examiner—Terry L. Englund
(74) Attorney, Agent, or Firm—Banner & Witcoff, Ltd.

(57) ABSTRACT

A semiconductor device comprises a charge pumping circuit including plural stages of circuit portions connected in series. Each circuit portion has a transistor having a drain and gate connected to each other and a capacitor having a connection node at which one electrode of the capacitor is connected to the drain of the transistor in such a way that potentials to be applied to adjoining connection nodes of individual capacitors alternately attain a high level and a low level when the charge-pumping circuit is operating. When the charge-pumping circuit stops operating, each of the potentials of the connection nodes of the individual capacitors is fixed at a high level if an output voltage of the charge-pumping circuit is positive.

14 Claims, 11 Drawing Sheets

SEMICONDUCTOR DEVICE WITH A CHARGE PUMPING CIRCUIT

CROSS-REFERENCE TO RELATED APPLICATION

This application is based upon and claims the benefit of priority from the prior Japanese Patent Application No. 11-073491, filed Mar. 18, 1999, the entire contents of which are incorporated herein by reference.

BACKGROUND OF THE INVENTION

The present invention relates to a charge-pumping circuit which produces a boosted voltage. More particularly, this invention pertains to a charge-pumping circuit which is demanded of low power consumption while a device in which the charge-pumping circuit is installed is stopping operation or is in a standby mode.

The microfabrication technology and schemes to reduction in the source voltage have improved the performances of semiconductor devices. Some of the semiconductor devices, such as memories which cannot set the voltage to be applied to memory cells or the like equal to an external voltage, incorporate a voltage boosting circuit or a charge-pumping circuit.

The electric potential boosted inside a chip by the charge-pumping circuit is maintained even when the chip is stopped (inactive or standby mode). This is to assure the chip performances, such as the access time, immediately after the transition from the standby state to the active state.

To hold the boosted potential even in the standby state, the charge-pumping circuit is designed to always monitor the boosted voltage level and automatically restart the charge-pumping operation if the inner potential drops due to leakage or the like in transistors. To achieve this function, the current dissipation of a device which carries out inner voltage boosting does not become zero even in standby mode. (This current will hereinafter be called "standby current".)

Recently, it has become typical to incorporate devices which implement inner voltage boosting into portable devices. This naturally makes the demand of reducing the standby current severer. This is because portable devices basically operate on the battery voltage so that even slight current flowing in such a portable device directly affects the performance of the device, such as making the standby time of the device shorter.

Accordingly, the allowed standby current of the charge-pumping circuits becomes smaller than the conventional standby current. The operation of the conventional charge-pumping circuit will now be described specifically from the viewpoint of reducing the standby current.

FIG. 1 is a diagram showing the structure of a typical conventional charge-pumping circuit. The main portion of the conventional charge-pumping circuit shown in FIG. 1 comprises transistors Qi (i: natural number) which has gate-drain common connection and capacitors Ci whose one electrodes are connected to the drains of the respective transistors Qi.

Multiple stages of circuits each comprising the transistor Qi and capacitor Ci are connected in series (i is 1 to 4 in this example) and the capacitor Ci of each stage is driven alternately to an "H" (High) level and an "L" (Low) level, thereby transferring charges.

Reference symbol "Qin" denotes an input transistor. The input end of the current path formed by the transistors Qi and the capacitors Ci is connected to an external voltage VDDO. A boosted output voltage VDDR is output from the source of the transistor Q4 of the last stage.

A control system for the conventional charge-pumping circuit as illustrated in FIG. 1 is constructed as follows.

An enable signal ENABLE is supplied to one input terminals of NAND gates NAND1 and NAND2. The output of the NAND gate NAND1 is supplied to the gate of the transistor Qin via an inverter $IV_1$.

The output signal, OSC, of an unillustrated oscillator is supplied to the other input terminal of the NAND gate NAND2. The output of the NAND gate NAND2 is separated into two paths to alternately drive the capacitors Ci. Specifically, the output of the NAND gate NAND2 is supplied to the other electrodes of the capacitors C1 and C3 via inverters $IV_2$, $IV_3$ and $IV_4$ in one path, and is supplied to the other input terminal of the NAND gate NAND1 and the other electrodes of the capacitors C2 and C4 via the inverter $IV_2$ and an inverter $IV_5$ in the other path.

This charge-pumping circuit is activated when the signal ENABLE becomes an "H" level. When the signal ENABLE becomes the "H" level, the output of the NAND gate NAND2 transfers the output signal OSC ("H"/"L" level) of the oscillator. The output of the NAND gate NAND1 transfers the output of the inverter $IV_5$ via the inverter $IV_1$, so that a timing signal of an "H"/"L" level is supplied to the gate of the transistor Qin.

The individual capacitors Ci which are connected to nodes adjoining with the associated transistor Qi for charge transfer in between are driven to different levels of "H" and "L". This allows charges to be transferred from one transistor to another so that the boosted output voltage VDDR is acquired from the transistor Q4 of the last stage.

From the viewpoint of charge transfer, it is desirable that the threshold voltage of the transistors Qi having diode connection be as close to 0V as possible. To meet this requirement, intrinsic transistors (I-type transistors) which are fabricated without making channel ion implantation in the substrate are used for the transistors (Qin and Qi) that constitute a charge-pumping circuit. Because the I-type transistor on the substrate has a low impurity concentration at the channel portion, the threshold voltage of that transistor can be set to approximately 0V.

FIG. 2A is a circuit diagram depicting individual potential nodes of an I-type transistor having diode connection formed on a substrate. FIG. 2B is a diagram illustrating characteristic curves of the drain current ID versus drain voltage VD of the I-type transistor under the conditions shown in FIG. 2A.

A substrate potential VB is the ground potential (VB=0V). The log scale (the scale on the left-hand side of the graph) will mainly be referred to when the drain voltage VD is lower than the source voltage VS (equal to the gate voltage VG), and the linear scale (the scale on the right-hand side of the graph) will mainly be referred to when the drain voltage VD is higher than the source voltage VS (equal to the gate voltage VG).

FIG. 3A is a circuit diagram depicting individual potential nodes of another I-type transistor formed on a substrate. FIG. 3B is a diagram illustrating characteristic curves of the drain current ID versus gate voltage VG of the I-type transistor under the conditions shown in FIG. 3A. As indicated by arrows in FIG. 3B, the log scale on the left-hand side will be referred to for the upper curves and the linear scale on the right-hand side will be referred to for the lower curves.

FIG. 4A is a circuit diagram depicting individual potential nodes of an I-type transistor formed on a substrate. FIG. 4B is a diagram illustrating characteristic curves of the drain current ID versus gate voltage VG under the conditions shown in FIG. 4A. As likewise indicated by arrows in FIG. 4B, the log scale on the left-hand side will be referred to for the upper curves and the linear scale on the right-hand side will be referred to for the lower curves.

Attention is paid to the states of the individual nodes in the charge-pumping circuit shown in FIG. 1 when the charge-pumping circuit becomes the standby state from the active state to stop the charge-pumping operation.

In general, in the standby state where the charge-pumping operation is stopped, the signal ENABLE becomes the "L" level, forcibly inhibiting the supply of the output signal OSC of the oscillator. That is, nodes N1 to N4 of the capacitors of the individual stages are disabled while having the alternate "H" level and "L" level.

As shown in FIGS. 2A and 2B, even when the backward bias is applied to the transistors Qi of the individual stages that have diode connection, the transistors Qi do not go into a cut-off state. With the drain voltage VD being 10V, particularly, a current of about 20 $\mu A$ flows when the source voltage VS (VG) is 1V.

As shown in FIGS. 3B and 4B, the I-type transistor has a negative threshold voltage, so that even when the gate voltage becomes negative, this transistor will not be turned off and a slight current keeps flowing. That is, the instance the charge-pumping circuit shown in FIG. 1 stops, the reverse charge flow occurs through the transistors Qi of the individual stages. The greater the difference between the driving voltage (VDDO) of the charge-pumping circuit and the boosted output voltage (VDDR) becomes, the larger the amount of the reverse-flowing charges gets.

If the reverse-flowing charges decrease the level of the voltage boosted node, the charge-pumping circuit should operate to supplement the potential as mentioned above.

In other words, the presence of the reverse-flowing charges in the charge-pumping circuit is one factor to increase the standby current and the amount of the reverse-flowing charges increases as the level difference between the external voltage and the boosted potential becomes greater. It is therefore extremely difficult to meet both of the recent requirements of reducing the external voltage and reducing the standby current.

To improve the cut-off characteristic of transistors to such a degree that the reverse-flowing charges become negligible, the value of the gate voltage VG corresponding to ID=$10^{-9}$ A in FIG. 4B should be shifted above VG=0V. This means that the improvement cannot be achieved unless the threshold voltage Vth of the transistors is set to is equal to or higher than +0.5V.

If the threshold voltage Vth of transistors is increased by channel ion implantation or the like as mentioned above, however, the back bias effect increases, thus significantly deteriorating the current supplying capability in the charge-pumping operation. This necessitates the use of I-type transistors at present.

The problem that the conventional charge-pumping circuit shown in FIG. 1 has at the time it changes to the active state from the standby state will now be discussed by using the results of simulation of the initial characteristics of the charge-pumping operation shown in FIGS. 5A and 5B.

FIG. 5A presents a characteristic diagram illustrating the transition of the charge-pumping circuit until the capacitor nodes are restored to the stable level where they have the alternate "H" and "L" levels when the charge-pumping circuit is reactivated. FIG. 5B presents a characteristic diagram illustrating the transition of the charge-pumping circuit until the stable current supply is resumed when the charge-pumping circuit is reactivated.

As each capacitor node is not at the proper level due to the reverse charge flow from the boosted voltage level as indicated by an arrow-headed period A along the time axis in FIGS. 5A and 5B, it takes time to achieve the alternate "H" and "L" levels at the time the operation returns to the active state from the standby state. This means that it takes time for the charge-pumping circuit to output the maximum current.

Unless the effective period A of the charge-pumping operation in which the charge-pumping circuit goes to the active state from the standby state can be shortened, the charge-pumping operation cannot supplement the boosted current consumed in the chip immediately after the charge-pumping circuit becomes active. This disables the assurance of the chip performances such as the access time.

The problems of the conventional charge-pumping circuit will be summarized below.

As mentioned above, the instance the conventional charge-pumping circuit stops, the reverse flow of charges to be transferred to the capacitors Ci via the transistors Qi of the individual stages occurs and it cannot be reduced as long as I-type transistors are used as the transistors Qi of the individual stages.

Because the conventional charge-pumping circuit has to operate to supplement the potential if the reverse charge flow reduces the level of the voltage boosted node in standby mode, the current dissipation increases inevitably.

As each capacitor node in the charge-pumping circuit is not at the proper level due to the reverse charge flow from the boosted voltage level, it takes time to resume the stable current supply when the charge-pumping circuit is reactivated.

BRIEF SUMMARY OF THE INVENTION

Accordingly, it is an object of the present invention to provide a charge-pumping circuit which uses I-type transistors and has a control system that can suppress the reverse charge flow in standby mode.

That is, this invention aims at providing a charge-pumping circuit having a control system that can reduce the current dissipation when the charge-pumping operation is stopped (when an associated device is in standby mode) and can shorten the time for the output current acquired provided the charge-pumping operation to reach the maximum value when the charge-pumping circuit is reactivated.

To achieve the above object, according to one aspect of this invention, there is provided a charge-pumping circuit comprising a circuit including plural stages of circuit portions connected in series, each circuit portion having a transistor having a drain and gate connected together and a capacitor having a connection node at which one electrode of the capacitor is connected to the drain of the transistor in such a way that driving potentials to be applied to adjoining connection nodes of individual capacitors alternately become a high level and a low level when the charge-pumping circuit is in operation, wherein when the charge-pumping circuit stops operating, the driving potentials of the connection nodes of the individual capacitors are all fixed to a same level close to an output level of the charge-pumping circuit.

The charge-pumping circuit receives an external source voltage as input voltage and outputs a boosted voltage in a power source circuit to be used in at least one of writing, reading and erasing storage data in a memory cell array of a semiconductor memory device based on internal control signals of the semiconductor memory device, and the boosted voltage being input to at least one of a row decoder, a column decoder and a source/well decoder of the memory cell array.

According to this invention, all of the driving potentials of the capacitors are set to the same level close to the output level of the charge-pumping circuit when the charge-pumping operation is stopped, it is possible to minimize the loss of the inner boosted potential caused by the reverse current from transistors which have gate-drain common connection and are connected to the respective stages. It is also possible to at least assure the difference between the capacitor driving voltages at the individual stages at the initial stage of the charge-pumping operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 6:
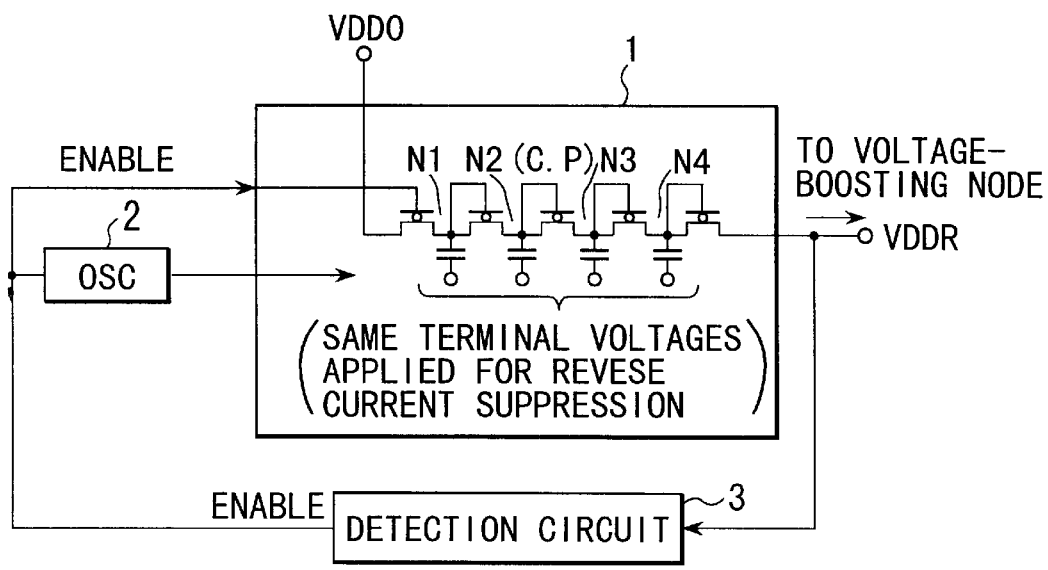
FIG. 6 is a diagram depicting the block structure of a charge-pumping circuit according to a first embodiment of this invention.

FIG. 6 is a block diagram depicting the structures of a charge-pumping circuit according to a first embodiment of this invention and a control circuit for the charge-pumping circuit. To begin with, the fundamental structure of the charge-pumping circuit according to the first embodiment will be discussed with reference to FIG. 6.

The charge-pumping circuit shown in FIG. 6 comprises a main portion 1 having I-type transistors and capacitors, an oscillator 2 and a detection circuit 3.

When the charge-pumping operation is stopped (in standby mode), the driving voltages of capacitor nodes N1 to N4 of the main portion 1 of the charge-pumping circuit are all fixed to a voltage close to a potential of the voltage boosted node VDDR.

That is, when the charge-pumping operation is stopped, all the driving voltages of capacitor nodes N1 to N4 become the same level for reverse current suppression. At this time, the driving voltages are fixed to an "H" level for driving the capacitors when the potential VDDR is positive, and are fixed to an "L" level for driving the capacitors when the potential VDDR is negative.

When the charge-pumping operation is stopped, an output signal OSC from the oscillator 2 which normally transfers an "H"/"L" level becomes invalid by the operation stop control that is executed in response to an enable signal ENABLE. At this time, the charge-pumping circuit transfers the same level for reverse current suppression to the capacitor nodes N1–N4.

Of course, the potential of the voltage boosted node becomes lower than a reference potential even in a standby state as the time passes. At this time, the detection circuit 3 controls the signal ENABLE to restart the charge-pumping operation. When the potential of the voltage boosted node reaches the reference potential, the detection circuit 3 controls the signal ENABLE to stop the charge-pumping operation. The same level for reverse current suppression is transferred to the individual capacitor nodes at this time too.

Figure 7:
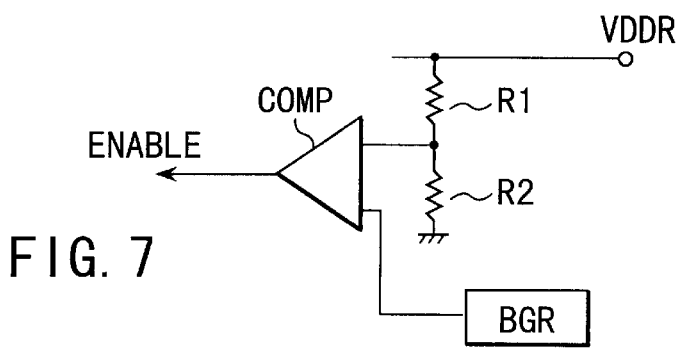
FIG. 7 is a diagram depicting the structure of a detection circuit in the charge-pumping circuit according to the first embodiment of this invention.

As shown in FIG. 7, the detection circuit 3 includes a comparator COMP which compares a predetermined potential acquired by, for example, dividing the potential VDDR by resistances R1 and R2, with a reference potential from a BGR (Band Gap Reference) circuit.

A boosted potential can be supplemented slowly in standby mode as opposed to the actual operation which must supplement the boosted potential rapidly. Because of lower dissipation power being preferable, it is desirable to separate the detection circuit 3 into two systems, one for the actual operation and the other for the standby mode. That is, the detection circuit 3 comprises two circuits, one having a relatively high sensitivity for the actual operation and the other having a relatively low sensitivity for the standby mode.

According to this invention, to stop a semiconductor device in a standby state, all of the driving voltages of the capacitors of the individual stages in the charge-pumping circuit incorporated in the device are set to an "H" level or "L" level close to the boosted voltage level and all of the potentials of the connection nodes N1 to N4 of the capacitors are set equal to the level for reverse current suppression, thereby disabling the capacitors. This provides the following advantages.

First, it is possible to minimize the loss of the inner boosted potential in standby mode which is caused by the reverse current from the transistors having gate-drain common connection that are connected to the respective stages.

Secondly, at the time of shifting the operational state from the standby state to the active state, it is possible to at least assure the difference between the capacitor driving voltages at the individual stages. This can shorten the time needed for the charge-pumping circuit to output the maximum current. Those advantages will now be discussed referring to a specific circuit.

Figure 8:
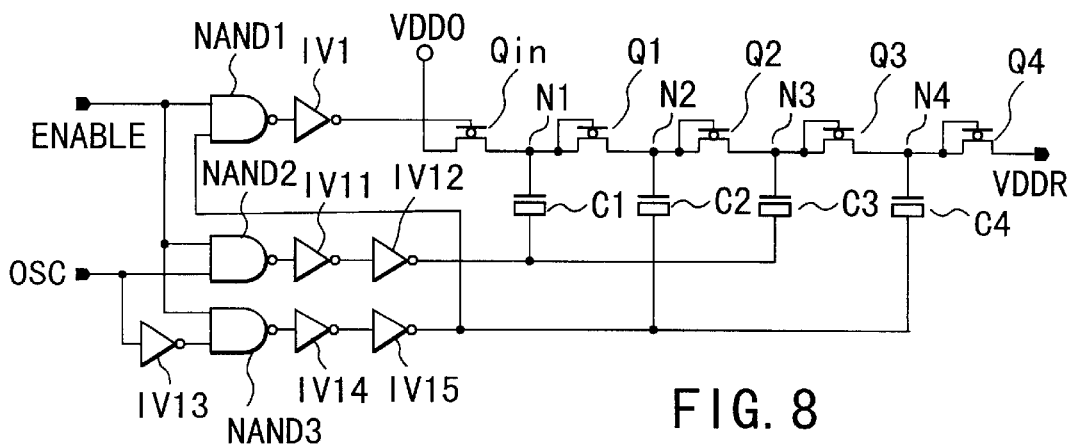
FIG. 8 is a diagram showing the circuit structure of the charge-pumping circuit according to the first embodiment of this invention.

FIG. 8 is a diagram showing the specific circuit structure of the charge-pumping circuit according to the first embodiment. The main portion of the charge-pumping circuit is constructed by connecting multiple stages of circuits in series each having an I-type transistor Qi (i being 1 to 4 in this example) having its gate and drain connected together (diode connection) and a capacitor Ci having one electrode connected to the drain of the transistor Qi.

As the capacitor Ci of each stage is driven alternately to an "H" (High) level and an "L" (Low) level, charges are transferred. Reference symbol "Qin" denotes an input transistor. The input end of the current path is connected to an external voltage VDDO. A boosted output voltage VDDR is output from the source of the transistor Q4 of the last stage.

A control system for this charge-pumping circuit is constructed as follows. An enable signal ENABLE is supplied to one input terminals of NAND gates NAND1, NAND2 and NAND3. The output of the NAND gate NAND1 is supplied to the gate of the transistor Qin via an inverter $IV_1$.

The output signal OSC of an unillustrated oscillator is supplied to the other input terminal of the NAND gate NAND2. The output of the NAND gate NAND2 is supplied to the other electrodes of the capacitors C1 and C3 via inverters $IV_{11}$ and $IV_{12}$.

The output signal OSC of the unillustrated oscillator is supplied to the other input terminal of the NAND gate NAND3 via an inverter $IV_{13}$. The output of the NAND gate NAND3 is supplied to the other input terminal of the NAND gate NAND1 and the other electrodes of the capacitors C2 and C4 via inverters $IV_{14}$ and $IV_{15}$.

The charge-pumping circuit according to the first embodiment shown in FIG. 8 is activated when the signal ENABLE becomes an "H" level. When the signal ENABLE becomes the "H" level, the outputs of the NAND gates NAND2 and NAND3 transfer the output signal OSC ("H"/"L" level) of the oscillator. The output of the NAND gate NAND1 transfers the output of the inverter $IV_{15}$ via the inverter $IV_1$, so that a timing signal of an "H"/"L" level is supplied to the gate of the transistor Qin. The individual capacitors Ci which are connected to nodes adjoining with the associated transistor Qi for charge transfer in between are driven to different levels of "H" and "L". This allows charges to be transferred from one transistor to another so that the boosted output voltage VDDR is acquired from the transistor Q4 of the last stage.

In standby mode, the signal ENABLE becomes the "L" level and the charge-pumping operation is stopped. At this time, the supply of the output signal OSC of the oscillator is forcibly stopped. However, the operation of the control system which comprises the NAND gates and inverters shown in FIG. 8 sets all the driving potentials of the capacitors of the individual stages to the "H" level. As a result, the nodes N1 to N4 are disabled all at the "H" level.

This stop control can reduce by Q=C·V the charges stored by the reverse current to the nodes that would have conventionally been disabled at the "L" level. In this equation, C is the capacitance of the capacitor Ci of each stage and V is the voltage level of the external voltage VDDO.

Figure 9:
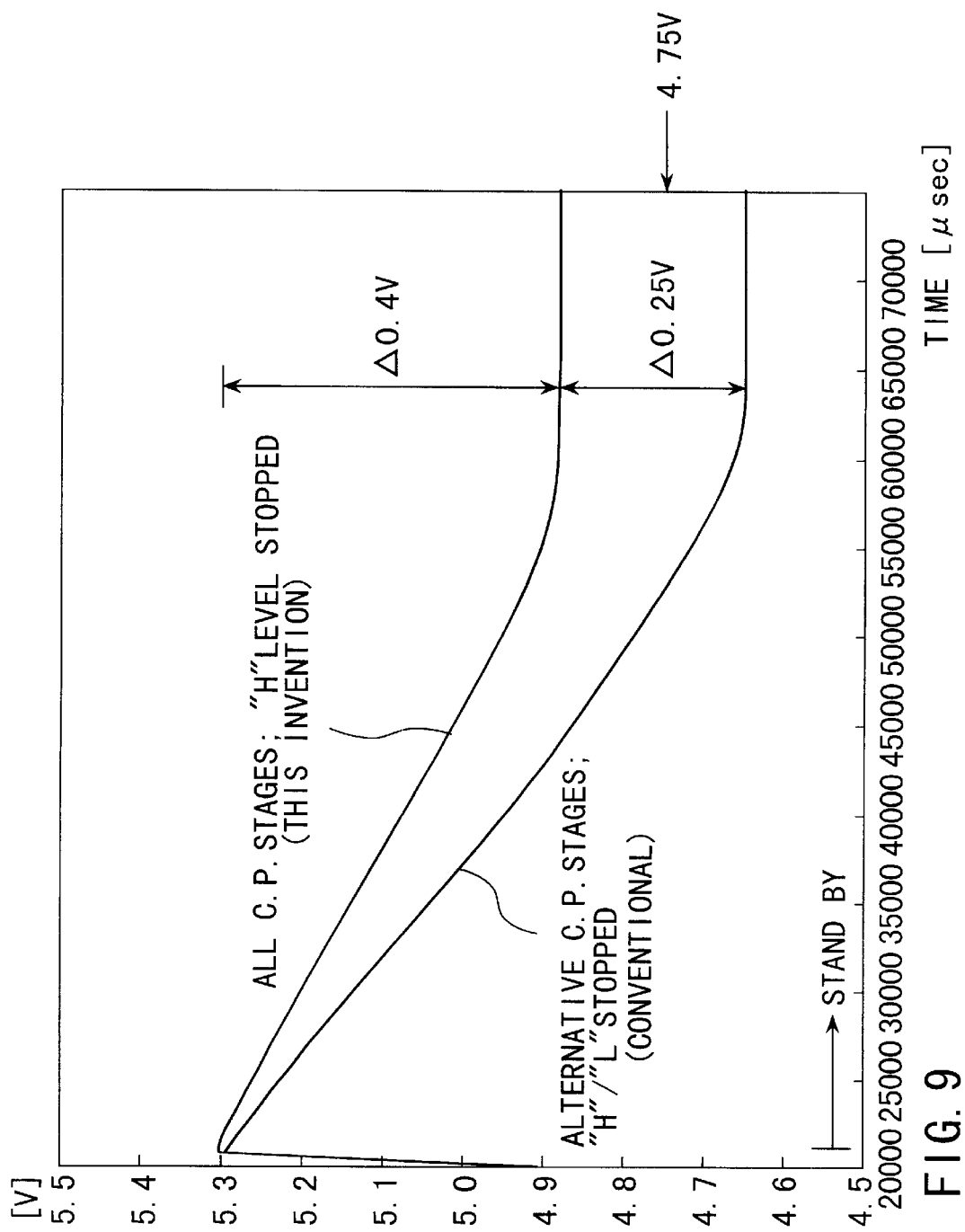
FIG. 9 is a diagram showing the results of simulation of how the boosted voltage level decreases by the reverse charge flow of the charge-pumping circuit according to the first embodiment of this invention.

FIG. 9 is a characteristic diagram showing the results of simulation of the reverse current characteristic of the charge-pumping circuit (all stages stopped at the "H" level) according to the first embodiment as compared with the results of simulation of the reverse current characteristic of the conventional charge-pumping circuit (stages alternately stopped at the "H" and "L" levels). The charge-pumping circuit embodying this invention suppresses the reverse-current originated reduction in the boosted voltage level by about ⅔ of the reduction caused by the prior art.

Therefore, the charge-pumping circuit according to the first embodiment can meet both a reduction in the source voltage and a reduction in the standby current within a lower source voltage range.

Figures 10A, 10B:
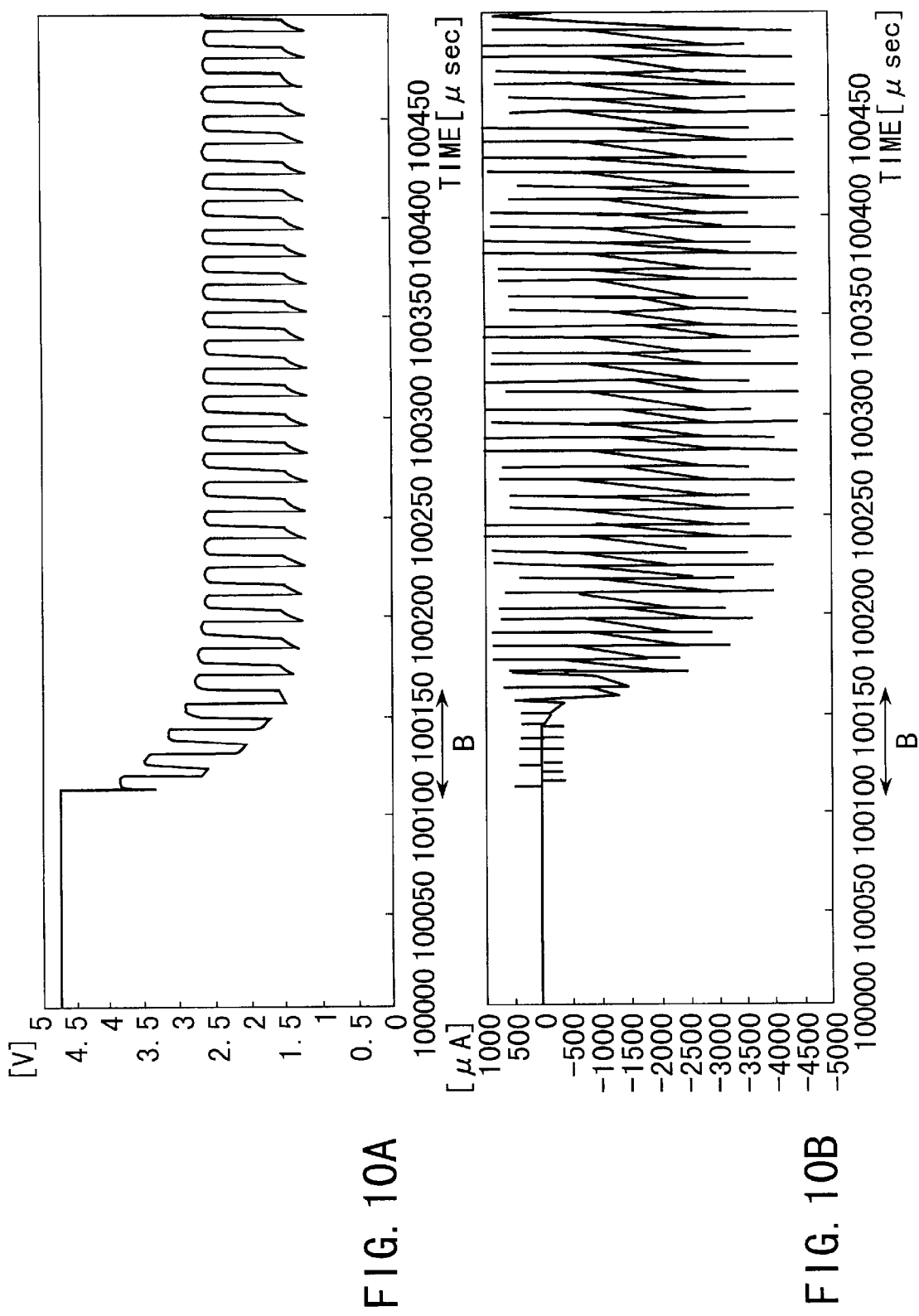
FIG. 10A is a diagram showing the results of simulation of the initial voltage characteristics of the charge-pumping operation when the charge-pumping circuit of the first embodiment goes to the active state from the standby state.
FIG. 10B is a diagram showing the results of simulation of the initial current characteristics of the charge-pumping operation when the charge-pumping circuit of the first embodiment goes to the active state from the standby state.

FIGS. 10A and 10B are diagrams showing the results of simulation of the initial characteristics of the charge-pumping operation when the charge-pumping circuit of the first embodiment shown in FIG. 8 goes to the active state from the standby state.

Figure 1:
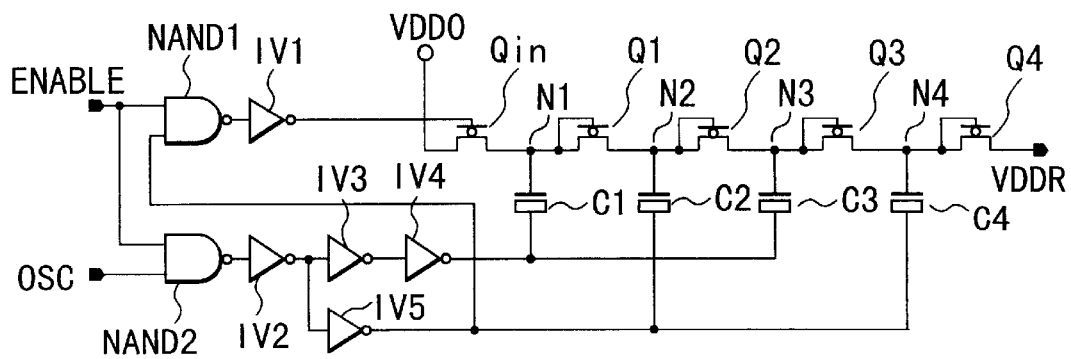
FIG. 1 is a diagram showing the structure of the conventional charge-pumping circuit.
Figure 2A:
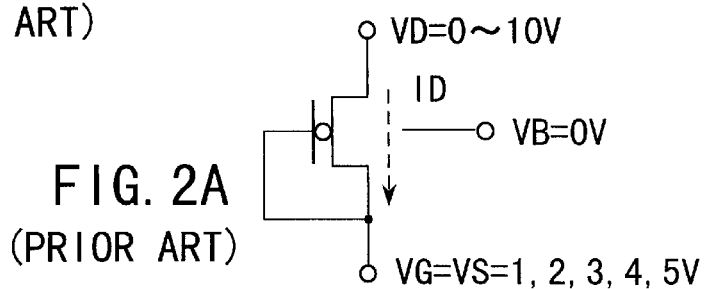
FIG. 2A is a circuit diagram depicting individual potential nodes of an I-type transistor having diode connection formed on a substrate.
Figure 2B:
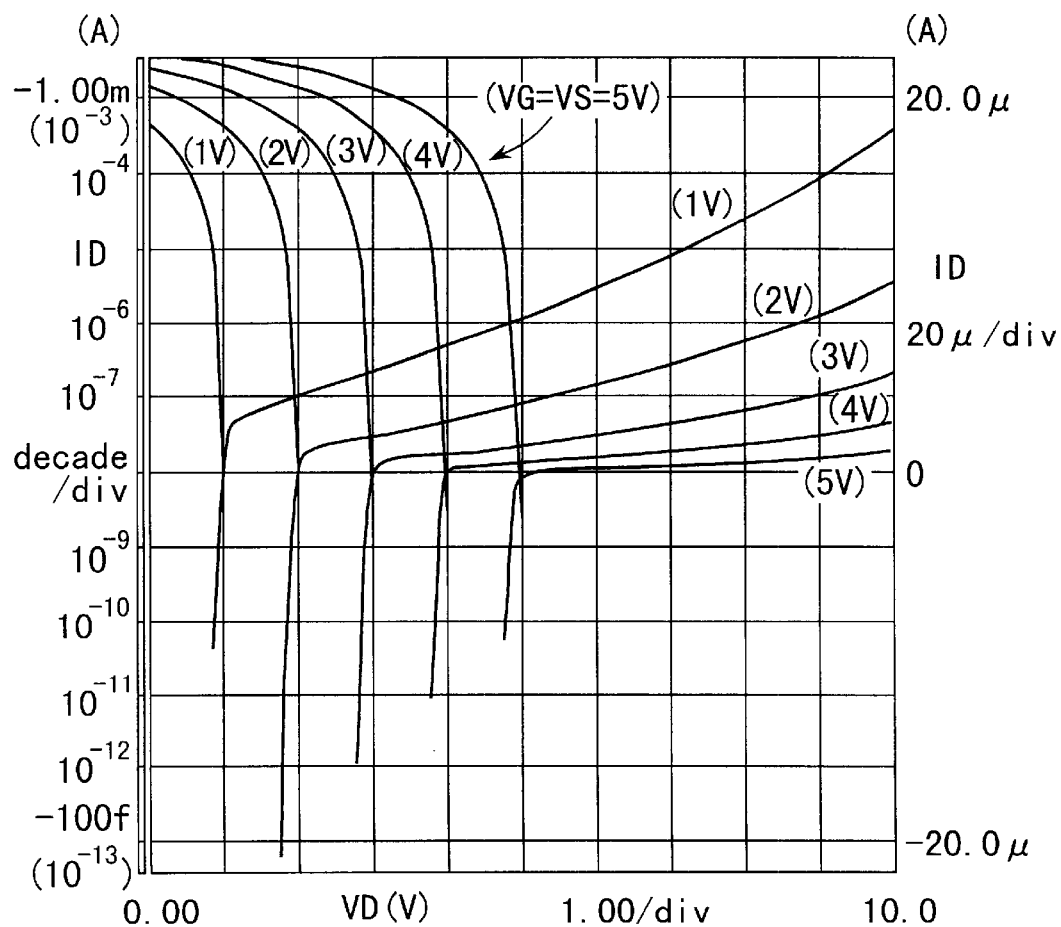
FIG. 2B is a diagram illustrating characteristic curves of the drain current ID versus drain voltage VD under the conditions shown in FIG. 2A.
Figure 3A:
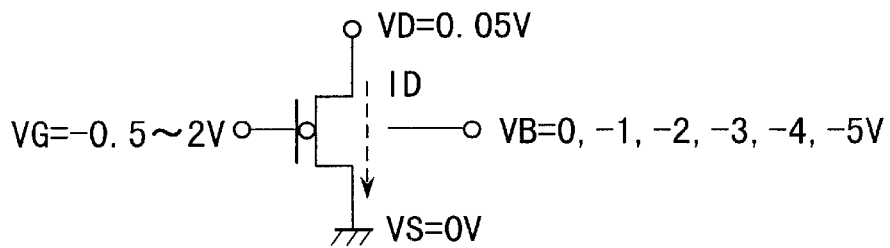
FIG. 3A is a circuit diagram depicting individual potential nodes of another I-type transistor formed on a substrate.
Figure 3B:
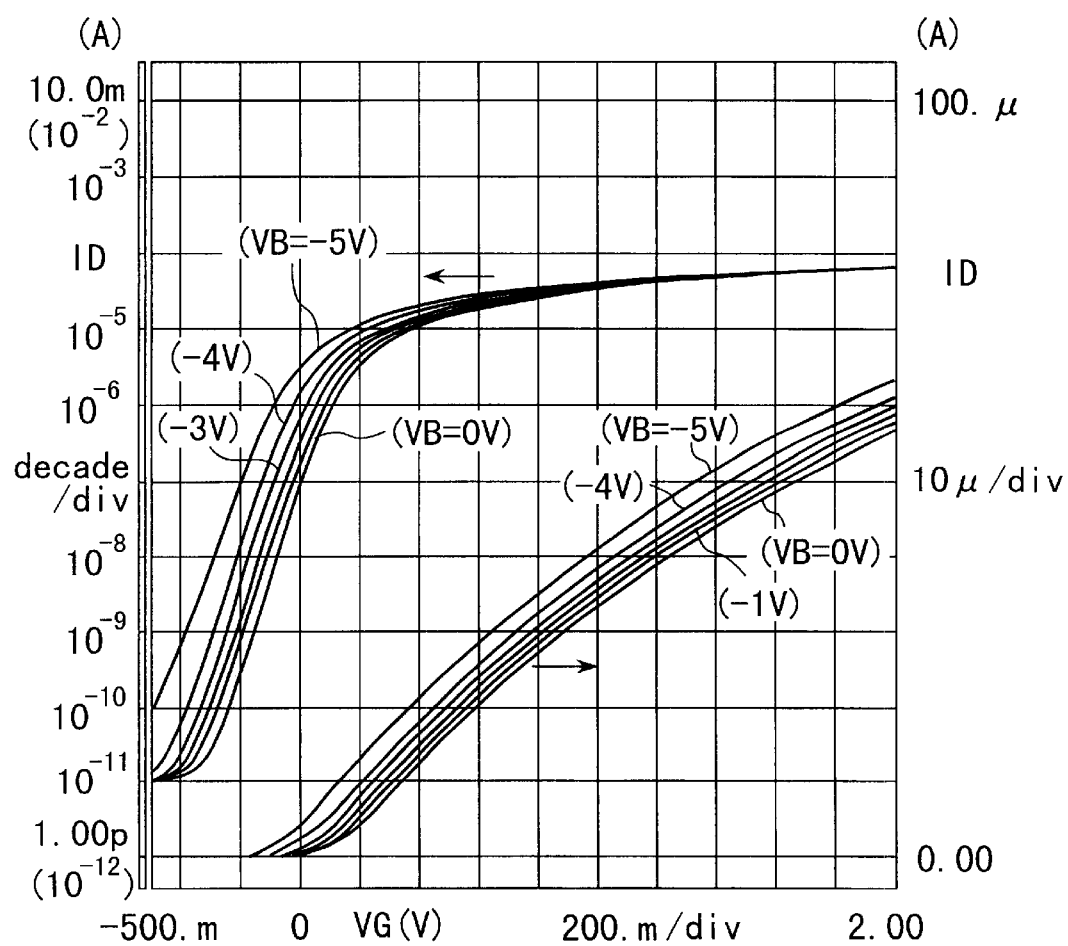
FIG. 3B is a diagram illustrating characteristic curves of the drain current ID versus gate voltage VG under the conditions shown in FIG. 3A.
Figure 4A:
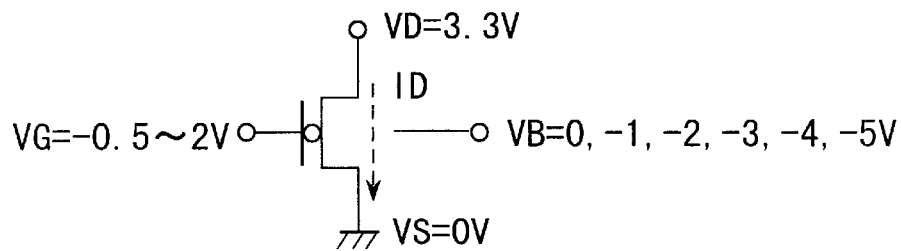
FIG. 4A is a circuit diagram depicting individual potential nodes of an I-type transistor formed on a substrate.
Figure 4B:
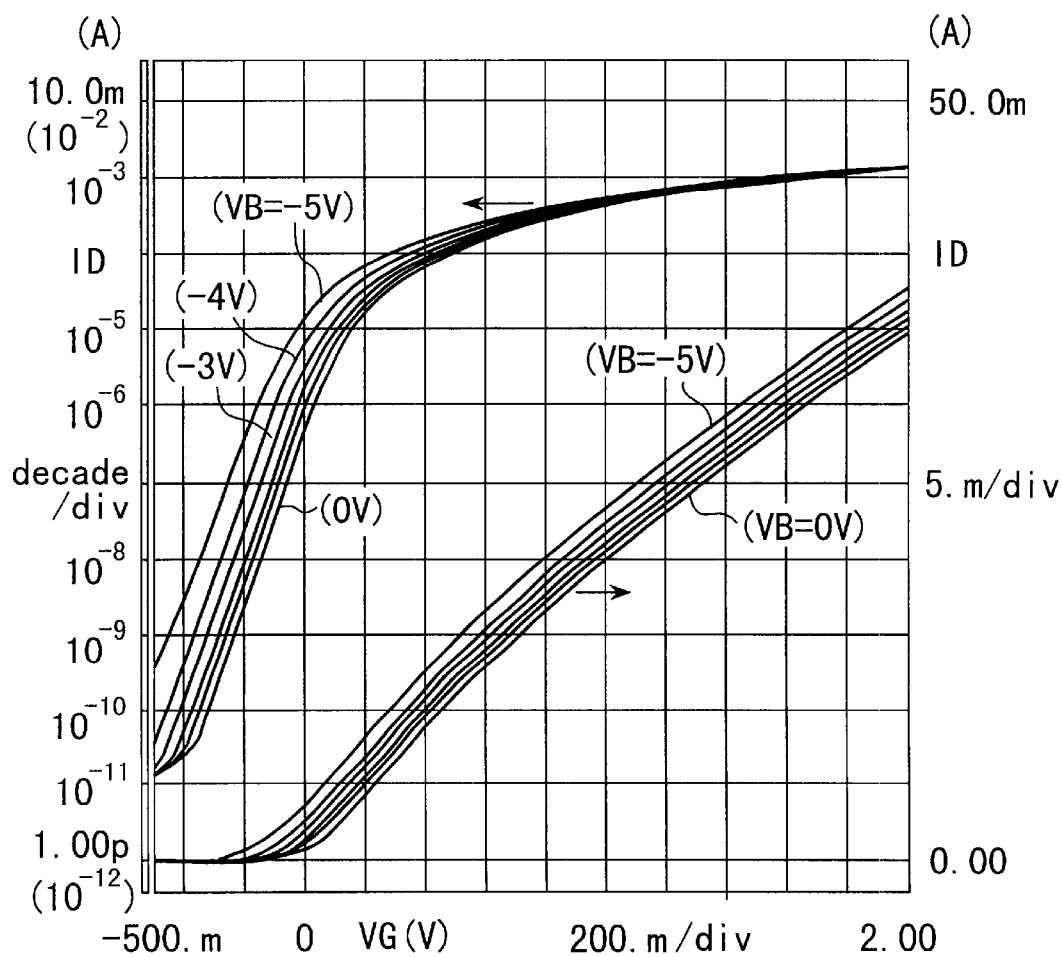
FIG. 4B is a diagram illustrating characteristic curves of the drain current ID versus gate voltage VG under the conditions shown in FIG. 4A.

As has been explained earlier with reference to FIGS. 5A and 5B, the conventional charge-pumping circuit shown in FIG. 1 has the problem such that as each capacitor node is not at the proper level due to the reverse charge flow from the boosted level, it takes time to achieve the alternate "H" and "L" levels when the operation returns to the active state from the standby state at the level restoring time and it needs the period A for the charge-pumping circuit to output the maximum current.

Referring to the characteristic charts illustrated in FIGS. 10A and 10B which are associated with this invention, immediately after the operation starts, the nodes N1 to N4 in FIG. 8 which all have had the "H" level have alternate "H"

and "L" levels so that the potential difference between the capacitor driving voltages at the individual stages is secured.

Figures 5A, 5B:
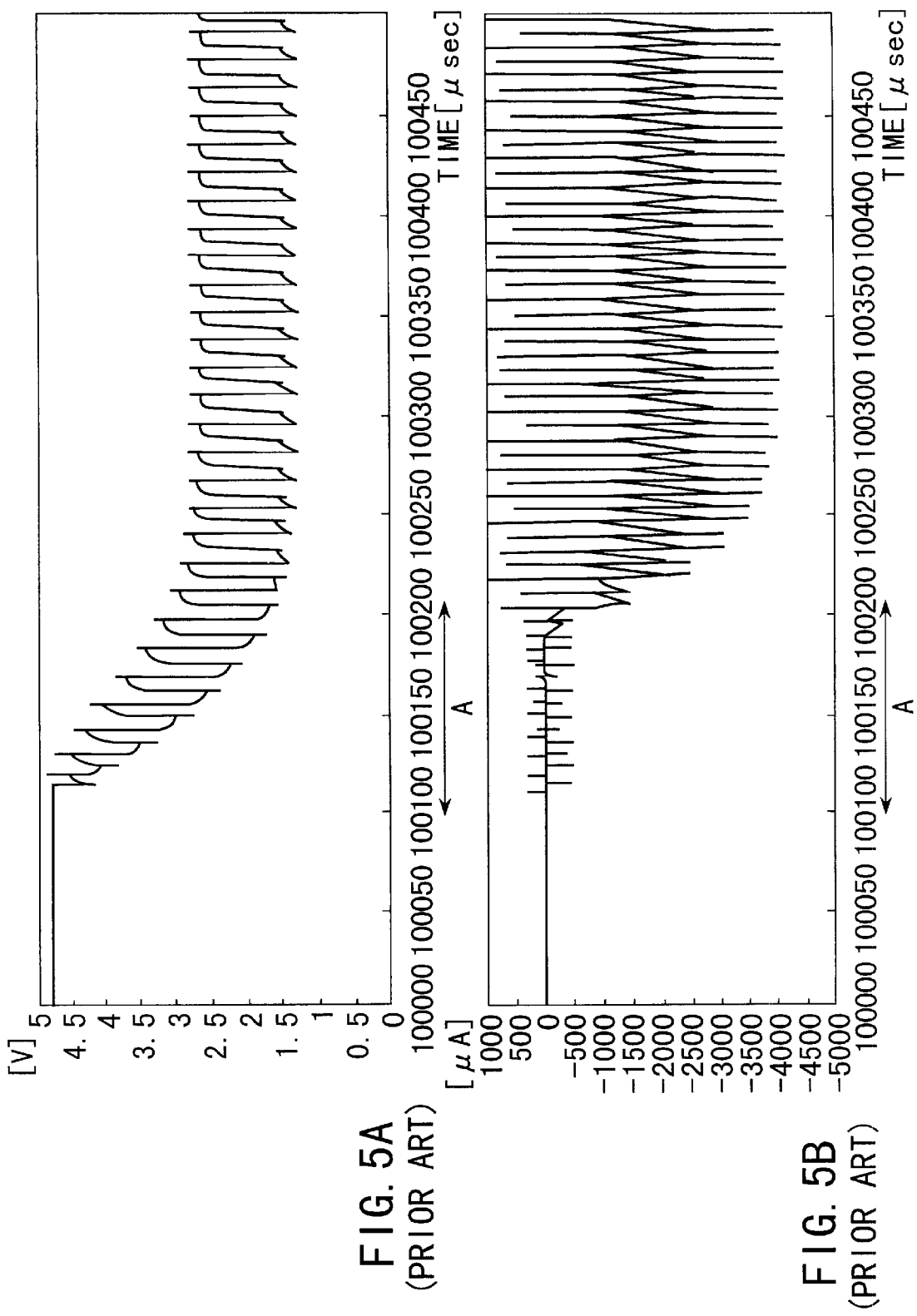
FIG. 5A is a diagram showing the results of simulation of the initial voltage characteristics of the charge-pumping operation when the conventional charge-pumping circuit goes to the active state from the standby state.
FIG. 5B is a diagram showing the results of simulation of the initial current characteristics of the charge-pumping operation when the conventional charge-pumping circuit goes to the active state from the standby state.

As the charge-pumping operation resumes from this state, an arrow-headed period B in FIGS. 10A and 10B for the charge-pumping circuit to start outputting the maximum current is shortened by approximately ½ as compared with the arrow-headed period A in FIGS. 5A and 5B. Accordingly, the charge-pumping circuit of this invention can quickly supplement the loss of the boosted potential inside the chip immediately after the charge-pumping circuit becomes active. This can assure the chip performances such as the access time.

At the time of disabling the semiconductor device in the standby state, the charge-pumping circuit according to the first embodiment can disable all the nodes of the capacitors of the individual stages at the "H" level. This can provide the following advantages.

(1) It is possible to minimize the loss of the inner boosted potential in standby mode which is caused by the reverse current from the transistors having gate-drain common connection that are connected to the respective stages.

(2) At the time of shifting the operational state from the standby state to the active state, it is possible to at least assure the potential difference for driving the capacitors at the individual stages. This can significantly shorten the time needed for the charge-pumping circuit to output the maximum current.

The circuit structure of this invention which suppresses the reverse charge flow by setting the connection nodes of all the capacitors to the same level when the charge-pumping operation is stopped can take various forms in addition to the one shown in FIGS. 6 and 8. For a charge-pumping circuit which outputs a negative boosted potential, the connection nodes of all the capacitors have only to be set to the same "L" level when the charge-pumping operation is stopped.

A second embodiment of this invention will now be described referring to FIG. 11. The following description of the second embodiment will discuss an application of the charge-pumping circuit that has been described in the foregoing description of the first embodiment.

Figure 11:
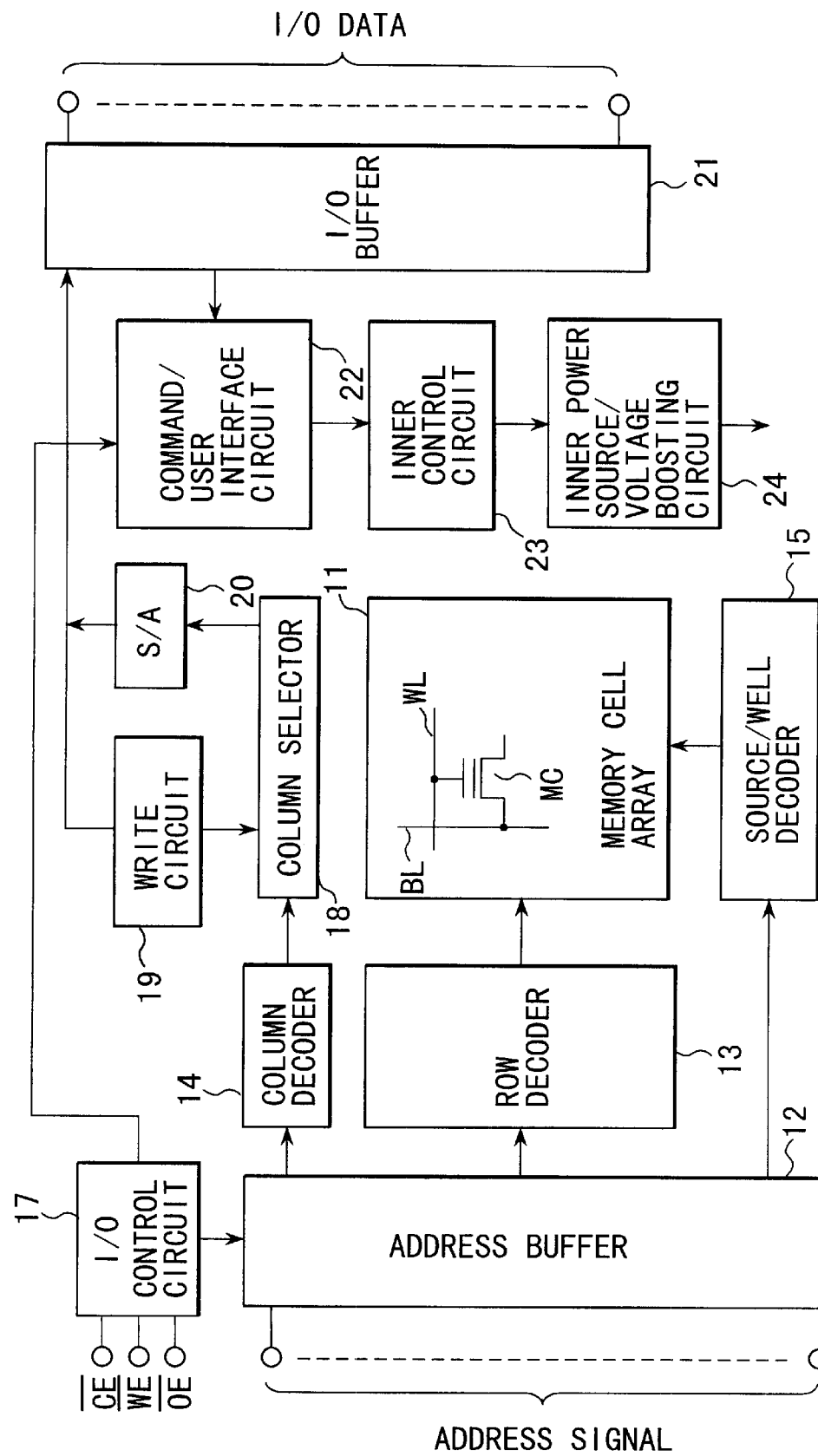
FIG. 11 is a diagram depicting the block structure showing an application of a charge-pumping circuit according to a second embodiment of this invention.

FIG. 11 is a block diagram exemplifying the internal structure of a chip when the charge-pumping circuit according to the first embodiment is adapted for use in a non-volatile semiconductor memory device.

In FIG. 11, a memory cell array 11 has a plurality of bit lines BL and word lines WL (only one shown for both types), and a plurality of memory cells MC (flash cells: only one shown) each of which has a floating gate, a control gate, a source and a drain. By injecting electrons in the floating gate of each memory cell MC to thereby change the threshold voltage, data is electrically programmed in or erased from the memory cell MC.

The control gate of each memory cell MC is connected to one of the word lines WL, and the drain to one of the bit lines BL. The sources of the individual memory cells MC are connected to a common source line (not shown) for each bit line, each word line or each block as a unit.

An address buffer 12 generates an inner address signal in response to an external address signal. The inner address signal generated by the address buffer 12 is connected to a row decoder 13, a column decoder 14 and a source/well decoder 15.

An input/output (I/O) control circuit 17 receives a chip enable signal /CE, a write enable signal /WE and an output enable signal /OE all externally supplied and generates various kinds of control signals to control the operations of the inner circuits based on those input signals.

For instance, the control signal based on the chip enable signal /CE is supplied to the address buffer 12 which in turn can generate an inner address signal based on the control signal. The control signal based on the output enable signal /OE is supplied to an I/O buffer 21 to be described later to thereby allow the I/O buffer 21 to perform a data output operation based on this control signal. The control signal based on the write enable signal /WE is supplied to a write circuit 19 to be described later to thereby allow the write circuit 19 to perform a data write operation based on this control signal.

The row decoder 13 selects one of the word lines WL in the memory cell array 11 based on the inner address signal (inner row address signal). A column selector 18 selects one bit line BL in the memory cell array 11 based on the decoded output from the column decoder 14.

The source/well decoder 15 selects one source line in the memory cell array 11 based on the inner address signal and supplies a predetermined voltage to the selected source line or well. In data write mode, the write circuit 19 supplies write data to any selected memory cell in the memory cell array 11 to write the data there.

A sense amplifier (S/A) 20 senses read data from the selected memory cell in the memory cell array 11 in data read mode. The I/O buffer 21 sends externally supplied data to the write circuit 19 in data write mode and sends out data to be sensed by the sense amplifier 20 in data read mode.

The I/O buffer 21 is also supplied with command data for setting various operation modes, such as a data write operation, data erase operation and a data read operation, and a product mode at the time of developing a plurality of mode products. The I/O buffer 21 is connected to a command/user interface circuit 22.

This command/user interface circuit 22 receives a control signal output from the I/O control circuit 17. This command/user interface circuit 22 receives command data coming from the I/O buffer 21 at the time when the write enable signal /WE is activated.

The output of the command/user interface circuit 22 is supplied to an inner control circuit 23. The inner control circuit 23 generates an inner control signal according to the received command data. This inner control signal is supplied to an inner power source/voltage boosting circuit 24.

Based on the inner control signal, the inner power source/voltage boosting circuit 24 receives an external power source voltage and generates an inner power source voltage or a boosted voltage using the charge pumping, both from the received external power source voltage. The inner power source voltage or the boosted voltage generated by the circuit 24 is distributed to the individual circuits in the same chip. As this voltage boosting circuit 24, the charge-pumping circuit according to the first embodiment shown in FIG. 6 and its control circuit can be used.

A third embodiment of this invention will now be described referring to FIGS. 12 through 15. The following description of the third embodiment will discuss a power source system which controls the charge-pumping circuit as the power source of a non-volatile semiconductor memory device that has been described in the foregoing description of the second embodiment.

Figure 12:
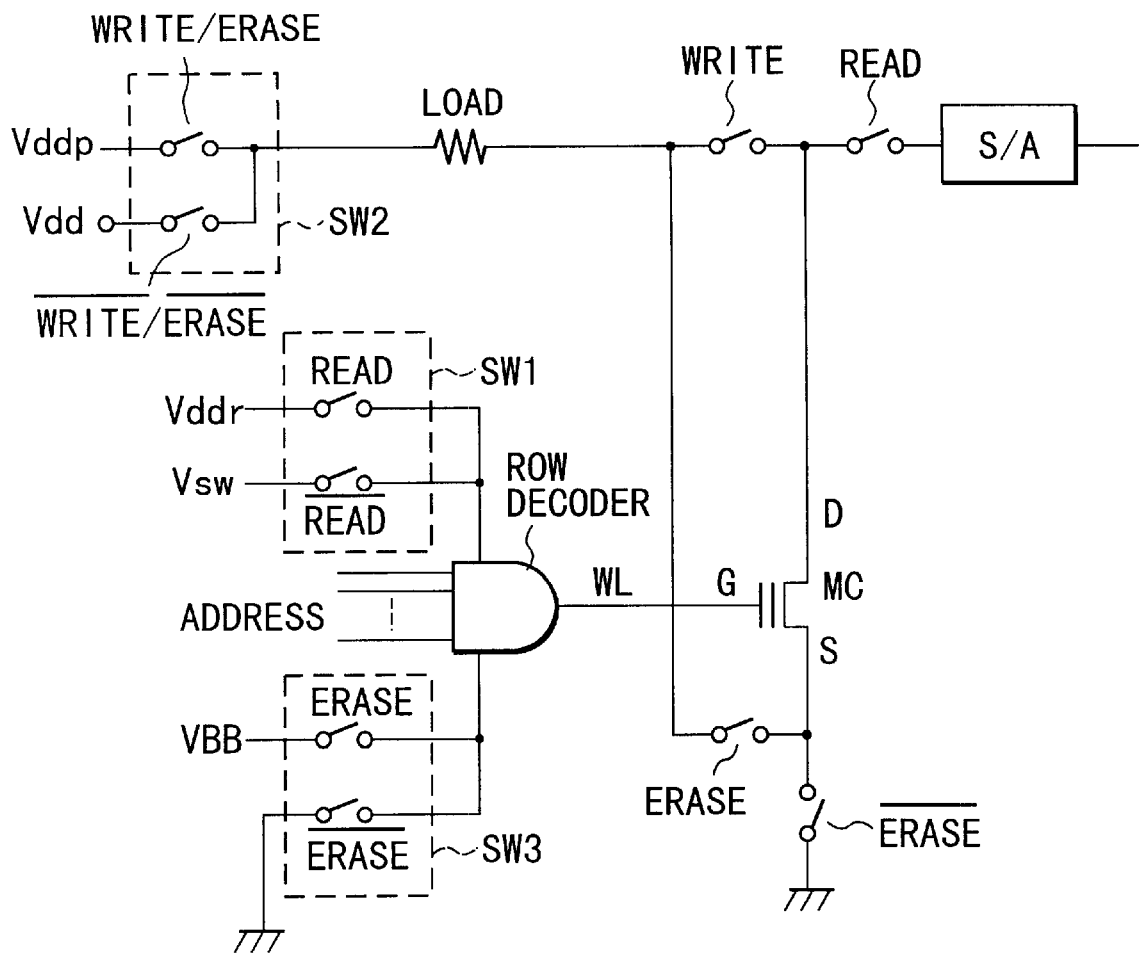
FIG. 12 is a diagram illustrating a power source system for a non-volatile semiconductor memory device according to a third embodiment of this invention.

Before going into the specific description of this power source system, a description will be given of the voltage values that are needed in the read, write and erase operations of the memory cells of the non-volatile semiconductor memory device. FIG. 12 shows the source S, drain D and gate G of a single memory cell MC and a word line WL connected to the gate G.

In data read mode, a boosted potential of 5V is applied to the gate G (word line WL) of the memory cell MC, 1V and 0V are respectively applied to the drain D and the source S, and the current that flows through the cell is sensed by a sense amplifier S/A. In write mode, the boosted potential is applied to the word line WL, 5V and 0V are respectively applied to the drain D and the source S, and hot electrons that are produced between the drain D and source S are injected into the floating gate.

After data erasure, −7V is applied to the word line WL and 5V is applied to the source S with the drain D set open, so that the high voltage between the floating gate and source emits electrons through the FN (Fowler-Nordheim) tunneling.

FIG. 12 is a diagram schematically illustrating the system for applying the voltage to memory cells in read mode, write mode and erase mode. The word line WL of the memory cell is driven by a row decoder. The high-potential level of this decoder is connected to Vddr=5V in read mode and to Vsw=8V in write mode by a switch SW1.

The low-potential level of the row decoder is connected to VBB=−7V by a switch SW3 after erasure. As a result, 5V is applied to the word line WL or the gate G of the memory cell in read mode, 8V is applied there in write mode and −7V is applied in erase mode.

The drain D of the memory cell is applied with 1V via the sense amplifier S/A in read mode, and is connected to a resistor LOAD via which 5V is applied to the drain D in write mode. The drain D is set open in erase mode. The source S of the memory cell MC is applied with 5V via the resistor LOAD in erase mode, and is grounded in the other modes. The resistor LOAD is connected to the voltage Vdd and the charge-pump output Vddp via a switch SW2.

Figure 13:
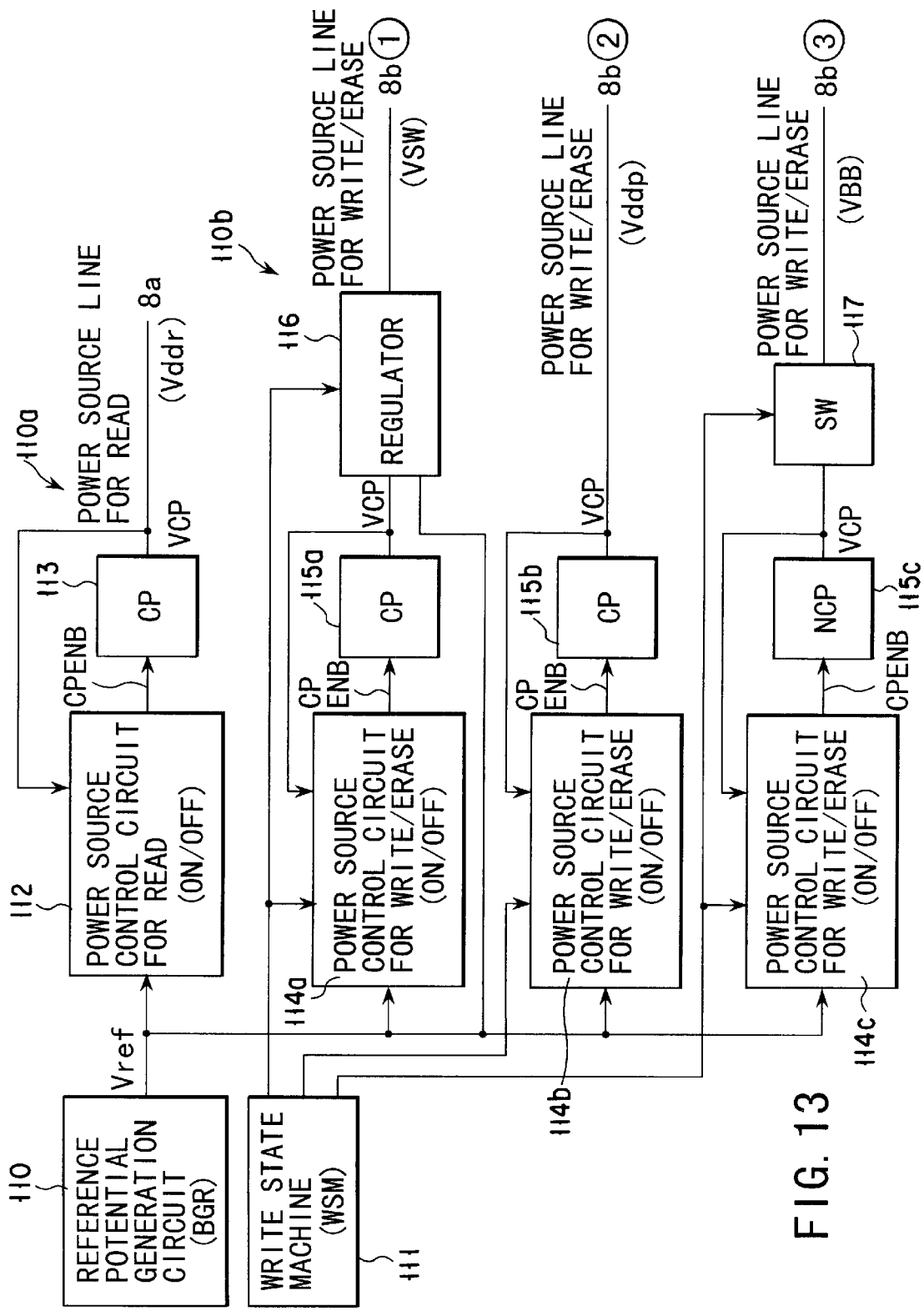
FIG. 13 is a diagram illustrating a power source for read and a power source for write/erase for the non-volatile semiconductor memory device according to the third embodiment.

FIG. 13 exemplifies the structures of a power source 110*a* for read and a power source 110*b* for write/erase. The read power source 110*a* and the write/erase power source 110*b* generate potentials of desired levels based on the output of a reference potential generation circuit 110 which uses, for example, a band gap reference (BGR) circuit. There are the following three ways of generating the potentials of the desired levels.

Case 1: By performing ON/OFF control on the charge-pumping circuit.

Case 2: By further controlling the output acquired in case 1 by using a regulator.

Case 3: By switching between the output acquired in case 1 and a constant potential (VSS, for example).

In FIG. 13, the read power source 110*a* and a power source line 8*b*② in three power source lines 8*b*① to 8*b*③ for the write/erase power source 110*b* correspond to case 1. That is, the read power source 110*a* and the power source line 8*b*② for write/erase are comprised of control circuits 112 and 114*b* for performing ON/OFF control on associated charge-pumping circuits 113 and 115*b* (shown as "CP") and those charge-pumping circuits 113 and 115*b*.

Those power source circuits perform such control that the charge-pumping circuits are driven when the power source voltage level is lower than a desired level, and they stop their operations when the power source voltage level reaches the desired level.

The power source line 8*b*① corresponding to case 2 has an ON/OFF control circuit 114*a*, a charge-pumping circuit 115*a* which is controlled by this control circuit 114*a* and a regulator 116 for controlling the output level of the charge-pumping circuit 115*a*. Specifically, the power source line 8*b*① is used in the automatic data writing that repeats write and verify using a write voltage of 8V and a verify read voltage of 6.5V. The regulator 116 is used for such voltage control.

The power source line 8*b*③ corresponding to case 3 has an ON/OFF control circuit 114*c*, a charge-pumping circuit 115*c* (shown as "NCP") for a negative potential which is controlled by this control circuit 114*c*, and a switch circuit 117 for switching the output of this charge-pumping circuit 115*c*. The switch circuit 117 is provided to output VSS when the charge-pumping circuit 115*c* is not operating.

The above-described write/erase power sources of three systems are activated by an auto-control signal output from a write state machine 111 in accordance with the write/erase mode.

Figure 14:
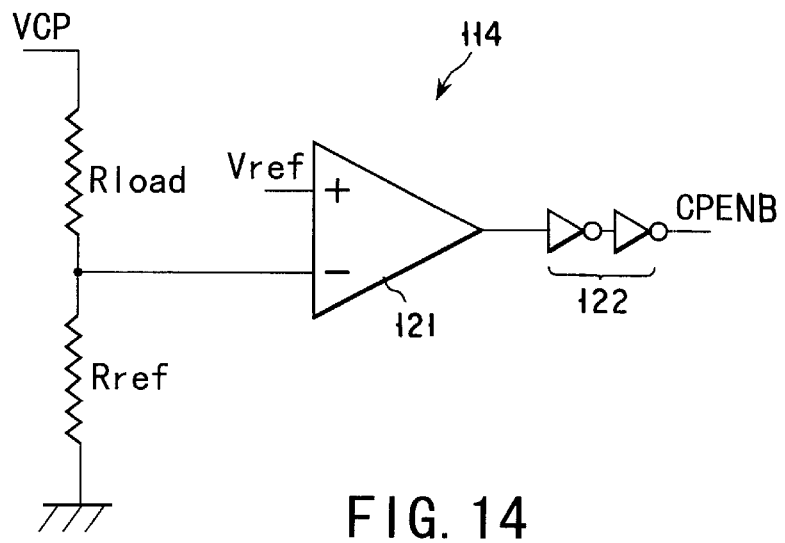
FIG. 14 is a diagram illustrating a control circuit which performs ON/OFF control of a charge-pumping circuit for the non-volatile semiconductor memory device according to the third embodiment.

FIG. 14 exemplifies the structures of the control circuits 114*a*, 114*b* and 114*c* (the same as the control circuit 112) which perform ON/OFF control of charge pumping in FIG. 13. The output VCP that is acquired by the charge-pumping circuits 113, 115*a*, 115*b*, 115*c*, etc. is sensed by a voltage dividing circuit of resistors Rload and Rref and is compared with the reference voltage Vref by an operational amplifier 121. The output of the operational amplifier 121 is acquired as a charge-pumping enable signal CPENB via a buffer 122.

Figure 15:
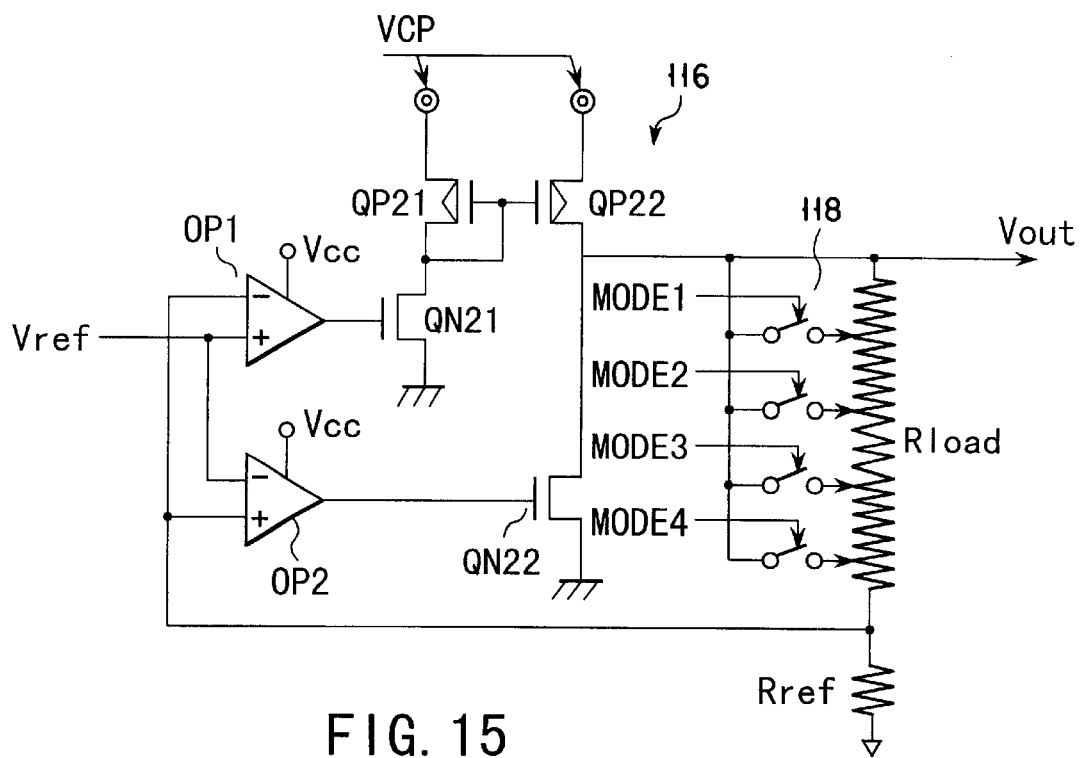
FIG. 15 is a diagram illustrating a regulator circuit which controls the output of the charge-pumping circuit for the non-volatile semiconductor memory device according to the third embodiment.

FIG. 15 shows one example of the regulator in FIG. 13. A regulator main body 116 has PMOS transistors QP21 and QP22, NMOS transistors QN21 and QN22 and two operational amplifiers OP1 and OP2. The PMOS transistors QP21 and QP22 and NMOS transistors QN21 and QN22 have the structure of a differential circuit which acquires the output VCP of the charge-pumping circuit by performing level control. The two operational amplifiers OP1 and OP2 control the differential circuit in accordance with the output level.

The output level is monitored as the voltage-divided output acquired by the resistors Rload and Rref, and is fed back to the operational amplifiers OP1 and OP2, thereby yielding a predetermined voltage level. The taps of the resistor Rload can be switched from one to another by a switch 118 which is controlled by mode signals MODE1 to MODE4. This switching controls the necessary power source level.

According to this invention, as described above, although the control circuit has a relatively simple structure of setting all the capacitor nodes of the individual stages to the level for reverse current suppression with respect to the charge-pump output, the current dissipation at the time of stopping the charge-pumping operation can be reduced significantly even by using I-type transistors which have an excellent charge transfer efficiency and have a threshold voltage of 0.5V or lower.

It is also possible to provide a charge-pumping circuit which can considerably shorten the time for the charge-pumping operation to provide the maximum current when the operation returns to the active state and can thus cope with reduction in the source voltage of a device.

Further, as has been explained in the foregoing descriptions of the second and third embodiments, the charge-pumping circuit embodying this invention is particularly suitable as a power source circuit which is used in any of the read operation, write operation, erase operation and automatic write and verify read operation of a non-volatile semiconductor memory device. The charge-pumping circuit of this invention is also suitable as a power source circuit for a general use semiconductor memory device other than the non-volatile semiconductor memory device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a charge pumping circuit including plural stages of circuit portions connected in series, each circuit portion having a transistor having a drain and gate connected to each other and a capacitor having a connection node at which one electrode of said capacitor is connected to said drain of said transistor in such a way that potentials to be applied to adjoining connection nodes of individual capacitors alternately attain a high level and a low level when said charge-pumping circuit is in operation,
    wherein when said charge-pumping circuit stops operating, each of said potentials of said connection nodes of said individual capacitors is fixed at a high level, if an output voltage of said charge-pumping circuit is positive.

2. The semiconductor device according to claim 1, further comprising means for controlling said output voltage so as to keep said output voltage at a predetermined value when said charge-pumping circuit stops operating.

3. The semiconductor device according to claim 1, wherein a threshold voltage of said transistors is equal to or lower than 0.5V.

4. A semiconductor device comprising:
    a charge-pumping circuit including plural stages of circuit portions connected in series, each circuit portion having a transistor having a drain and gate connected to each other and a capacitor having a connection node at which one electrode of said capacitor is connected to said drain of said transistor in such a way that potentials to be applied to adjoining connection nodes of individual capacitors alternately attain a high level and a low level when said charge-pumping circuit is in operation,
    wherein when said charge-pumping circuit stops operating, each of said potentials of said connection nodes of said individual capacitors is set at a high level to suppress reverse current caused by an output voltage of said charge-pumping circuit, if the output voltage of said charge-pumping circuit is positive.

5. The semiconductor device according to claim 4, further comprising means for controlling said output voltage so as to keep said output voltage at a predetermined value when said charge-pumping circuit stops operating.

6. The semiconductor device according to claim 4, wherein a threshold voltage of said transistors is equal to or lower than 0.5V.

7. A semiconductor device comprising:
    a charge pumping circuit including plural stages of circuit portions connected in series, each circuit portion having a transistor having a drain and gate connected to each other and a capacitor having a connection node at which one electrode of said capacitor is connected to said drain of said transistor in such a way that potentials to be applied to adjoining connection nodes of individual capacitors alternately attain a high level and a low level when said charge-pumping circuit is in operation,
    wherein when said charge-pumping circuit stops operating, each of said potentials of said connection nodes of said individual capacitors is fixed at a high level, if an output voltage of said charge-pumping circuit is positive, and
    said charge-pumping circuit receives an external power source voltage as an input voltage and outputs a boosted voltage in a power source circuit to be used in at least one of writing, reading and erasing storage data in a memory cell array of a semiconductor memory device based on internal control signals of said semiconductor memory device, said boosted voltage being input to at least one of a row decoder, a column decoder and a source/well decoder of said memory cell array.

8. The semiconductor device according to claim 7, wherein said semiconductor memory device is a non-volatile memory device.

9. The semiconductor device according to claim 7, wherein said power source circuit has an ON/OFF control circuit for driving said charge-pumping circuit when said boosted voltage of said power source circuit is lower than a predetermined value.

10. The semiconductor device according to claim 9, wherein said semiconductor memory device is a non-volatile memory device and said power source circuit to be used in writing or erasing said storage data further has a regulator circuit for controlling a value of said boosted voltage of said power source circuit and repeats automatic write and verify read.

11. The semiconductor device according to claim 9, wherein said power source circuit to be used in writing or erasing said storage data outputs a predetermined negative boosted voltage and further has a switch circuit for switching between said predetermined negative boosted voltage and a predetermined voltage and said switch circuit switches an output of said charge-pumping circuit to said predetermined voltage while an operation of said charge-pumping circuit is stopped.

12. A semiconductor device comprising:
    a charge-pumping circuit including plural stages of circuit portions connected in series, each circuit portion having a transistor having a drain and gate connected to each other and a capacitor having a connection node at which one electrode of said capacitor is connected to said drain of said transistor in such a way that potentials to be applied to adjoining connection nodes of individual capacitors alternately attain a high level and a low level when said charge-pumping circuit is in operation,
    wherein when said charge-pumping circuit stops operating, each of said potentials of said connection nodes of said individual capacitors is fixed at a low level, if an output voltage of said charge-pumping circuit is negative.

13. A semiconductor device comprising:
    a charge-pumping circuit including plural stages of circuit portions connected in series, each circuit portion having a transistor having a drain and gate connected to each other and a capacitor having a connection node at which one electrode of said capacitor is connected to said drain of said transistor in such a way that potentials to be applied to adjoining connection nodes of individual capacitors alternately attain a high level and a low level when said charge-pumping circuit is in operation, wherein when said charge-pumping circuit stops operating, each of said potentials of said connection nodes of said individual capacitors is set at a low level to suppress reverse current caused by an output voltage of said charge-pumping circuit, if an output voltage of said charge-pumping circuit is negative.

14. A semiconductor device comprising:

a charge-pumping circuit including plural stages of circuit portions connected in series, each circuit portion having a transistor having a drain and gate connected to each other and a capacitor having a connection node at which one electrode of said capacitor is connected to said drain of said transistor in such a way that potentials to be applied to adjoining connection nodes of individual capacitors alternately attain a high level and a low level when said charge-pumping circuit is in operation, wherein when said charge-pumping circuit stops operating, each of said potentials of said connection nodes of said individual capacitors is fixed at a low level, if an output voltage of said charge-pumping circuit is negative, and said charge-pumping circuit receives an external power source voltage as an input voltage and outputs a boosted voltage in a power source circuit to be used in at least one of writing, reading and erasing storage data in a memory cell array of a semiconductor memory device based on internal control signals of said semiconductor memory device, said boosted voltage being input to at least one of a row decoder, a column decoder and a source/well decoder of said memory cell array.

* * * * *